United States Patent
Satou et al.

(10) Patent No.: US 10,156,789 B2
(45) Date of Patent: Dec. 18, 2018

(54) METHOD FOR STRIPPING RESIST FILM FROM METAL PLATE AND METHOD FOR MANUFACTURING ETCHED METAL PLATE

(71) Applicant: NISSHIN STEEL CO., LTD., Tokyo (JP)

(72) Inventors: Masaki Satou, Chiba (JP); Seiju Suzuki, Chiba (JP); Shuichi Sugita, Chiba (JP)

(73) Assignee: NISSHIN STEEL CO., LTD., Tokyo (JP)

( * ) Notice: Subject to any disclaimer, the term of this patent is extended or adjusted under 35 U.S.C. 154(b) by 0 days.

(21) Appl. No.: 15/757,408

(22) PCT Filed: Jun. 13, 2016

(86) PCT No.: PCT/JP2016/002856
§ 371 (c)(1),
(2) Date: Mar. 5, 2018

(87) PCT Pub. No.: WO2017/037970
PCT Pub. Date: Mar. 9, 2017

(65) Prior Publication Data
US 2018/0253009 A1 Sep. 6, 2018

(30) Foreign Application Priority Data

Sep. 3, 2015 (JP) ................. 2015-173829

(51) Int. Cl.
*G03F 7/42* (2006.01)
*C23F 1/14* (2006.01)
*G03F 7/031* (2006.01)
*G03F 7/20* (2006.01)
*G03F 7/029* (2006.01)
*G03F 7/16* (2006.01)

(52) U.S. Cl.
CPC ............... *G03F 7/422* (2013.01); *C23F 1/14* (2013.01); *G03F 7/029* (2013.01); *G03F 7/031* (2013.01); *G03F 7/16* (2013.01); *G03F 7/2002* (2013.01); *G03F 7/42* (2013.01)

(58) Field of Classification Search
CPC . G03F 7/42; G03F 7/422; G03F 7/032; G03F 7/033; G03F 7/038; G03F 7/039
USPC ................................................ 430/329, 331
See application file for complete search history.

(56) References Cited

U.S. PATENT DOCUMENTS

| | | | |
|---|---|---|---|
| 4,623,611 A | 11/1986 | West | |
| 5,454,985 A | 10/1995 | Harbin | |
| 6,127,097 A * | 10/2000 | Bantu | G03F 7/325 |
| | | | 430/313 |
| 2004/0050406 A1 * | 3/2004 | Sehgal | G03F 7/422 |
| | | | 134/26 |
| 2011/0024392 A1 | 2/2011 | Sato et al. | |
| 2014/0100151 A1 * | 4/2014 | Egbe | G03F 7/422 |
| | | | 510/176 |

FOREIGN PATENT DOCUMENTS

| | | |
|---|---|---|
| CN | 101878452 A | 11/2010 |
| CN | 101978001 A | 2/2011 |
| JP | 46-018922 B1 | 5/1971 |
| JP | 49-014681 B1 | 4/1974 |
| JP | 61-198237 A | 9/1986 |
| JP | 62-227153 A | 10/1987 |
| JP | 04-361265 A * | 12/1992 |
| JP | 05-100423 A | 4/1993 |
| JP | 07-076663 A | 3/1995 |
| JP | 09-265180 A | 10/1997 |
| JP | 2000-267302 A | 9/2000 |
| JP | 2002-129079 A | 5/2002 |
| JP | 2007-224165 A * | 7/2007 |
| JP | 2009-235272 A | 10/2009 |
| JP | 2010-053177 A | 3/2010 |
| JP | 2010-229378 A | 10/2010 |
| JP | 2014-157339 A | 8/2014 |
| WO | 2009/051237 A1 | 4/2009 |

OTHER PUBLICATIONS

Computer-generated translation of JP 2007-224165 (Sep. 2007) (Year: 2007).*
International Search Report from International Application No. PCT/JP2016/002856 dated Sep. 6, 2016.

* cited by examiner

*Primary Examiner* — John A McPherson
(74) *Attorney, Agent, or Firm* — Brundidge & Stanger, P.C.

(57) ABSTRACT

The purpose of the present invention is to provide a method for stripping a resist film, which includes a cured resin having a phosphate ester group or a carboxyl group, by using a resist stripping solution having high strippability, the method being characterized in that deterioration of the strippability of the resist stripping solution is suppressed and the phosphorus concentration in the resist stripping solution is not substantially increased. In this method, a resist stripping solution is brought into contact with a resist film, which includes a cured resin having a phosphate ester group or a carboxyl group and is disposed on a metal plate, and the resist film is stripped from the metal plate. In this method, the resist stripping solution contains a benzyl alcohol, water in a mass ratio to the benzyl alcohol of 0.3-2.5, and a surfactant, and is substantially free of caustic alkali components.

8 Claims, No Drawings

METHOD FOR STRIPPING RESIST FILM FROM METAL PLATE AND METHOD FOR MANUFACTURING ETCHED METAL PLATE

TECHNICAL FIELD

The present invention relates to a method for removing a resist film from a metal plate, and a method for producing an etched metal plate.

BACKGROUND ART

Metal plates provided with irregularity formed by etching the surface thereof are used in various applications, such as elevator doors where a high appearance is required. Etching of a metal plate is performed by corroding the metal using a liquid having a corrosive effect on metal (hereinafter, also referred to as a "etchant"), such as Iron(III) chloride aqueous solution, thereby forming recesses in the metal plate surface. Protrusions, during the etching, are formed by forming a film resistant to the etchant (hereinafter, also referred to as a "resist film") on the metal plate surface, thereby protecting the region where the film is formed from the etchant to remain as it is without being corroded. Such etching forms irregularity on the metal plate surface. Specifically, the metal plate surface is etched in the steps of: (1) forming a resist film in a region where a protrusion is to be formed on the metal plate surface, (2) corroding by using an etchant a region where the resist film is not formed, and (3) removing the resist film from the metal plate having the region where the resist film is not formed being corroded.

A resist film is conventionally formed in the steps of: (1-1) applying a photosensitive resin onto the metal plate surface, (1-2) adhering a negative film, which transmits light only to a region where a protrusion is to be formed, on the metal plate having the applied photosensitive resin thereon, (1-3) irradiating the metal plate with light through the negative film to cure only an exposed portion of the photosensitive resin, and (1-4) removing a non-exposed, thus non-cured portion of the photosensitive resin. In recent years, resist films are formed by an ink-jet method in some cases. The ink-jet method forms a resist film in the steps of: (1-1') discharging a composition containing the photosensitive resin from an ink-jet head to deposit the photosensitive resin in a region where a protrusion is to be formed on the metal plate surface, and (1-2') curing the deposited photosensitive resin by irradiation with an active energy ray.

In these steps, the resist film containing the cured photosensitive resin (hereinafter, also referred to as a "cured resin") is required to have satisfactory adhesiveness to the metal plate surface. Low adhesiveness to the metal plate surface may cause the resist film to partially separate from the metal plate surface. When the etchant intrudes into the interface between the partially separated resist film and the metal plate surface, metal in the region where the resist film is formed is also disadvantageously corroded.

A resist film formed by curing a curable composition which contains a compound having a phosphoester group in its molecule is known to have high adhesiveness to a metal plate (for example, Patent Literature (hereinafter, referred to as PTL) 1 to PTL 3).

Further, the resist film containing a cured resin is also required to have satisfactory resistance to the etchant (hereinafter, also referred to as "etchant resistance") and satisfactory solubility in a resist removing liquid which contains a caustic alkali component (hereinafter, also referred to as "alkali solubility").

In view of those requirements, a resist film formed by curing a curable composition which contains a compound having a carboxylic group and a (meth)acryloyl group in its molecule is known to have high etchant resistance and alkali solubility (for example, PTL 4 to PTL 6).

After the corrosion of the metal plate by using an etchant, the resist film is removed from the metal plate. A resist film is conventionally removed by dissolving the cured resin constituting the resist film in a resist removing liquid containing a caustic alkali component (for example, PTL 7). Such a resist removing liquid is repeatedly used for removing of resist films from metal plates by liquid circulation.

CITATION LIST

Patent Literature

PTL 1
Japanese Patent Application Laid-Open No. 2009-235272
PTL 2
Japanese Patent Application Laid-Open No. 2010-53177
PTL 3
Japanese Patent Application Laid-Open No. 2010-229378
PTL 4
Japanese Patent Application Laid-Open No. H5-100423
PTL 5
Japanese Patent Application Laid-Open No. H7-76663
PTL 6
Japanese Patent Application Laid-Open No. 2002-129079
PTL 7
Japanese Patent Application Laid-Open No. H9-265180

SUMMARY OF INVENTION

Technical Problem

A resist film formed from a curable composition as disclosed in, for example, PTLs 1 to 6 contains a cured resin having a phosphoester group or a carboxylic group. The cured resin decomposes into compounds having a phosphoester group or compounds having a carboxylic group, and is dissolved in a resist removing liquid containing a caustic alkali component.

Such compounds having a phosphoester group or compounds having a carboxylic group both dissolved in the resist removing liquid accumulate as the resist removing liquid is repeatedly used. This relatively reduces the concentration of the caustic alkali component in the resist removing liquid, and thus the property of the resist removing liquid, that is, capability of removing resist films (hereinafter, also referred to as "removability"), gradually decreases as the repeating number increases.

These compounds dissolved in the resist removing liquid have both a lipophilic moiety derived from a hydrocarbon chain generated by polymerization of the photosensitive resin, and a hydrophilic moiety derived from the phosphoester group or the carboxylic group in the molecule thereof, and thus have a foaming property the same as a surfactant. When those compounds dissolved in the resist removing liquid produce foam, the foam inhibits the contact between the resist removing liquid and the resist film, thereby further reducing removability of the resist removing liquid.

Due to these factors described above, removability of a resist removing liquid decreases as the repeating number increases. It is thus considered that a resist removing liquid is required to be periodically replaced. For reducing time and cost for etching of metal plates, it is desired to suppress reduction in removability of a resist removing liquid, and prolong the life of the liquid.

There is also a demand for lowering in the discharge amount of phosphorus contained in the compound having a phosphoester group from the view point of preventing environment pollution. A conventional method increases the phosphorus concentration in a resist removing liquid, and thus dephosphorization is necessary before drainage of the resist removing liquid to outside from facilities or a factory. For reducing time and cost for etching of metal plates, it is required to prevent the increase in the phosphorus concentration in a resist removing liquid, and thus allow the dephosphorization to become easier or unnecessary.

The resist removing liquid, meanwhile, is required to have high removability that enables removal of a resist film from a metal plate in a shorter time.

The present invention has been made under the above circumstances, and an object of the present invention is to provide a method for removing a resist film containing a cured resin having a phosphoester group or a carboxylic group by using a resist removing liquid having high removability, and the method suppresses reduction in removability of the resist removing liquid and substantially does not increase the phosphorus concentration in the resist removing liquid. Another object of the present invention is to provide a method for producing an etched metal plate, which employs the method for removing the resist film.

Solution to Problem

The present inventors have completed the present invention, as a result of extensive studies, by conceiving a method for satisfactorily removing a resist film with substantially no dissolving of a compound having the phosphoester group or a compound having the carboxylic group into the resist removing liquid.

The first mode of the present invention is a method for removing from a metal plate a resist film disposed thereon, which contains a cured resin having a phosphoester group and/or a carboxylic group, by bringing the resist film in contact with a resist removing liquid. In the present invention, the resist removing liquid contains benzyl alcohol, water with a mass ratio to benzyl alcohol of 0.3 or more and 2.5 or less, and a surfactant, and is substantially free of caustic alkali component.

The second mode of the present invention is a method for producing an etched metal plate, including the steps of: forming a resist film containing a cured resin having a phosphoester group or a carboxylic group, in a region where a protrusion is to be formed on the surface of the metal plate; corroding by using an etchant the surface of the metal plate in a region where the resist film is not formed; and removing the resist film from the metal plate having the corroded surface by the method relating to the first mode of the present invention.

Advantageous Effects of Invention

The present invention provides a method for removing a resist film containing a cured resin having a phosphoester group or a carboxylic group by using a resist removing liquid having high removability, and the method suppresses reduction in removability of the resist removing liquid and substantially does not increase the phosphorus concentration in the resist removing liquid. The present invention also provides a method for producing an etched metal plate, which employs the method for removing the resist film.

DESCRIPTION OF EMBODIMENTS

1. Method for Removing Resist Film

A first embodiment of the present invention relates to a method for removing from a metal plate a resist film disposed thereon, which contains a cured resin having a phosphoester group or a carboxylic group, by bringing the resist film in contact with a resist removing liquid. The resist removing liquid contains benzyl alcohol; water with a mass ratio to benzyl alcohol of 0.3 or more and 2.5 or less, and a surfactant, and is substantially free of caustic alkali component. In the present invention, "A or B" refers to either A or B, or both A and B. In the present invention, substantially free of "component (which may be any component)" means the amount of the component in a resist removing liquid being less than 1 mass %.

A resist film containing a cured resin having a phosphoester group or a carboxylic group is conventionally removed by being dissolved in a resist removing liquid containing a caustic alkali component. However, a compound derived from the dissolved cured resin relatively reduces the concentration of the caustic alkali component in the resist removing liquid. Further, the compound derived from the dissolved cured resin produces foam in the resist removing liquid, and the foam inhibits the contact between the resist removing liquid and the resist film. A conventional method, as deduced from the above, reduces removability of a resist removing liquid as the use thereof repeated, and thus it is considered that the resist removing liquid is required to be periodically replaced.

Dissolving a cured resin having a phosphoester group or a carboxylic group increases the phosphorus concentration in the resist removing liquid. The resist removing liquid after the treatment thus cannot be drained to outside of facilities or a factory as it is, and dephosphorization is considered to be necessary before drainage.

The method according to the present embodiment removes a resist film from a metal plate by swelling the film and separating the same from the metal plate. In the present method, a cured resin having a phosphoester group or a carboxylic group substantially does not dissolve in a resist removing liquid, and thus relative reduction of the concentration of the resist removing liquid due to a compound derived from the dissolved cured resin, and foaming are less likely to occur. Therefore, the method according to the present embodiment suppresses reduction in removability of a resist removing liquid compared to the conventional method.

The method according to the present embodiment removes a resist film without dissolving the same, and thus the phosphorus concentration in the resist removing liquid substantially does not increase after the removal of the resist film.

Further, the method according to the present embodiment enables the resist removing liquid to have high removability.

The resist film is formed in a region where a protrusion is to be formed on the surface of a metal plate, and has etchant resistance. When bringing the metal plate surface having the resist film formed thereon in contact with an etchant, on the metal plate surface, only a region where the resist film is not formed is corroded, and a region where the resist film is formed is protected from the etchant and is not corroded. This forms irregularity on the surface of the metal plate.

The resist film contains a cured resin having a phosphoester group or a carboxylic group. The resist film may contain other components in addition to the cured resin. Examples of the additional components include components unavoidably mixed in during or after the formation of the resist film.

Phosphoester group is a functional group represented by any one of the below-described formulas (a1) to (a3). The phosphoester group is contained in the cured resin for improving adhesion between the resist film and the metal plate, for example. Among the following formulas (a1) to (a3), in particular, a cured resin having the functional group represented by formula (a2) or (a3) is capable of increasing adhesion between the resist film and the metal plate by interaction with the metal plate, such as a condensation reaction between a hydroxyl group in the functional group and a hydroxyl group present on the metal plate surface. In particular, the resist film which contains the cured resin having the functional group represented by formula (a3) exhibits higher adhesion with metal. The cured resin having the functional group represented by formula (a2) has significantly low viscosity, and thus exhibits high dischargeability in an ink-jet method and enables easy formation of a resist film by the ink-jet method.

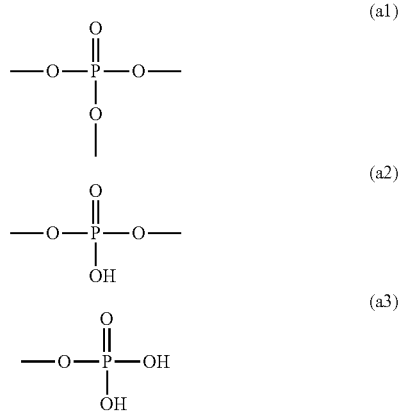

Carboxylic group is a functional group represented by —COOH. The carboxylic group is contained in the cured resin for improving etchant resistance and alkali solubility of the resist film, for example.

Whether the resist film contains a cured resin having a phosphoester group or a carboxylic group can be confirmed by a common analysis, such as nuclear magnetic resonance spectroscopy (NMR), Fourier transform infrared spectroscopy (FT-IR) or mass spectrometry (MS).

The cured resin preferably has a phosphoester group. Removing resists having a phosphoester group by a conventional method requires dephosphorization of a resist removing liquid after the removal of the resists; however, the method according to the present embodiment allows the dephosphorization of the resist removing liquid to become unnecessary or easier. Accordingly, time and cost for removing resists by the present method is lowered compared to a conventional method. The cured resin more preferably has both a phosphoester group and a carboxylic group. The method according to the present embodiment not only allows the dephosphorization to become unnecessary or easier, but also suppresses reduction in removability of a resist removing liquid, thereby reducing frequency of the liquid replacement. Accordingly, the present method further lowers time and cost for removing resists compared to a conventional method. Further, the method according to the present embodiment is conducted without dissolving the resist film in the resist removing liquid, and thus alkali solubility of the resist film is not necessarily high. It is thus possible for the curable composition substantially contain no carboxylic group. This enables use of more various curable compositions for the formation of resist films.

The metal plate may be any metal plate as long as etching thereon using an etchant is possible, and the resist film can adhere thereto. Examples of metal constituting such a metal plate include stainless steel, copper, carbon steel and iron-nickel alloy. Examples of the stainless steel include austenite stainless steel, such as SUS304 and SUS316, martensite stainless steel, such as SUS410, ferrite stainless steel, such as SUS430, and precipitation hardening stainless steel, such as SUS631. For using etched metal plates in applications where mechanical strength is required, the metal plates preferably contains, as a main material, work hardening cold-rolled austenite stainless steel or ferrite stainless steel, martensite stainless steel, or precipitation hardening stainless steel.

The resist removing liquid contains benzyl alcohol, water and a surfactant, and is substantially free of caustic alkali component. The resist removing liquid presumably swells a resist film by permeation of water into the resist film due to the presence of benzyl alcohol. The swelled resist film has reduced adhesion with the metal plate and is thus separated from the metal plate and removed.

The resist removing liquid contains water with a mass ratio of 0.3 or more and 2.5 or less relative to benzyl alcohol. When the mass ratio of water to benzyl alcohol is 0.3 or more, presumably, a satisfactory amount of the water can permeate inside the resist film, and thus the resist film satisfactorily swells, and is separated from the metal plate and removed. When the mass ratio of water to benzyl alcohol is 2.5 or less, presumably, the benzyl alcohol concentration becomes satisfactorily high to increase permeability of water into the resist film, and thus the resist film can be separated in a shorter time. From the above viewpoints, the mass ratio of water in a resist removing liquid relative to benzyl alcohol is preferably 0.5 or more and 2.0 or less, more preferably 0.7 or more and 2.0 or less, still more preferably 0.9 or more and 1.9 or less, and particularly preferably 1.2 or more and 1.9 or less.

In the resist removing liquid, the amounts of benzyl alcohol, water, a below-described surfactant and a caustic alkali component can be measured by a known method, such as nuclear magnetic resonance spectroscopy (NMR), or gas chromatography-mass spectrometry (GC-MS).

The water content can be adjusted to fall within the above range by mixing a predetermined amount of water with commercially available or synthesized benzyl alcohol. For further increasing removability of the resist removing liquid, water is preferably distilled water with less impurity.

The surfactant increases permeability of water into a resist film. The surfactant may be any one of anionic surfactants, cationic surfactants and nonionic surfactants.

Examples of the anionic surfactants include sulfonate surfactants, such as sodium xylene sulfonate, sodium dodecyl benzene sulfonate and sodium aryl alkyl polyether sulfonates, sulfate surfactants, such as sodium dodecyl sulfate, sodium tetradecyl sulfate, sodium pentadecyl sulfate, sodium octyl sulfate and sodium lauryl sulfate, and fatty acid surfactants, such as sodium oleate, sodium laurate, sodium caprate, sodium caprylate, sodium caproate, potassium stearate and calcium oleate.

Examples of the cationic surfactants include quaternary ammonium surfactants, such as tetramethylammonium chloride, hexadecyltrimethylammonium bromide, stearyltrimethylammonium chloride, benzalkonium chloride and benzethonium chloride, alkylamine surfactants, such as monomethylamine hydrochloride, dimethylamine hydrochloride and trimethylamine hydrochloride, and pyridinium surfactants, such as butylpyridinium chloride, dodecyl pyridinium chloride and cetylpyridinium chloride.

Examples of the nonionic surfactants include ether surfactants, such as polyethylene oxide, polypropylene oxide and a combination of polypropylene oxide and polyethylene oxide, ether ester surfactants, such as alkylphenol polyethylene oxide, esters of higher fatty acids and polyethylene glycol, and esters of higher fatty acids and polypropylene oxide, and ester surfactants, such as sorbitan esters. Preferred examples of the ether ester surfactants include dodecyl polyoxyethylene ether, hexadecyl polyoxyethylene ether, nonylphenyl polyoxyethylene ether, lauryl polyoxyethylene ether, sorbitan monooleate polyoxyethylene ether and styrylphenyl polyoxyethylene ether. Preferred examples of ester surfactants include monodecanoyl sucrose.

For further increasing removability of the resist removing liquid, the surfactant is preferably an anionic surfactant.

The surfactant content is preferably 3 mass % or more and 20 mass % or less based on the total mass of the resist removing liquid. When the surfactant content based on the total mass of the resist removing liquid is 3 mass % or more, presumably, a satisfactory amount of water can permeate inside a resist film, and thus the resist film more satisfactorily swells, and is more likely to be separated from the metal plate and removed. When the surfactant content is 20 mass % or less based on the total mass of the resist removing liquid, presumably, the benzyl alcohol concentration becomes satisfactorily high to further increase permeability of water into the resist film, and thus the resist film can be separated in a shorter time.

The caustic alkali component is a hydroxide of an alkali metal. Examples of the caustic alkali components include sodium hydroxide and potassium hydroxide.

The resist removing liquid is substantially free of caustic alkali component, and therefore, the cured resin does not dissolve in the resist removing liquid or only a trace amount of the cured resin dissolves therein. Therefore, reduction in removability of a resist removing liquid due to a compound dissolved in the resist removing liquid, which has a phosphoester group or a carboxylic group can be suppressed. For further suppressing reduction in the removability due to dissolution of the cured resin, it is preferred that the resist removing liquid is substantially free of additional components other than benzyl alcohol, water and a surfactant.

Bringing the resist removing liquid in contact with a resist film means the resist removing liquid being in contact with the resist film adhering on a metal plate. For example, a metal plate having a resist film adhering thereon may be immersed in a resist removing liquid, or a resist removing liquid may be applied on a metal plate having a resist film adhering thereon by spray coating or flow coating.

The liquid temperature of the resist removing liquid to be in contact with a resist film is preferably 30° C. or more and 80° C. or less. When the liquid temperature is 30° C. or more, presumably, a satisfactory amount of water can permeate inside the resist film, and thus the resist film more satisfactorily swells, and is more likely to be separated from the metal plate and removed. When the liquid temperature is 80° C. or less, the evaporation rate of water becomes low, and it becomes easier to keep the mass ratio of water to benzyl alcohol constant during the resist removing.

The method according to the present embodiment may be repeatedly performed on different metal plates. Repeatedly performing the method according to the present embodiment means bringing one and the same resist removing liquid in contact with, in sequence, two or more metal plates each having the above-described resist film, and removing the resist film from each metal plate. Specifically, the resist removing liquid used in the method according to the present embodiment is recovered, subjected to liquid circulation, and brought in contact with the resist film of another metal plate having the resist film.

The method according to the present embodiment may further include a step of withdrawing the removed resist film from the resist removing liquid. The method according to the present embodiment may also include a step of adding water to the resist removing liquid in an amount lost during evaporation. The removed resist film can be withdrawn from the resist removing liquid by, for example, skimming the resist film separated from the metal plate with mesh, or filtering the resist removing liquid.

The removability of the resist removing liquid is less likely to be reduced even though the method according to the present embodiment is performed continuously for long period. Therefore, the method can be performed repeatedly for a longer period without replacing the resist removing liquid, but only by appropriately removing separated resist films and replenishing evaporated water. Accordingly, the method according to the present embodiment can lower time and cost necessary for removing resist films.

Further, the method according to the present embodiment enables dephosphorization before the drainage of the resist removing liquid to become unnecessary or easier. The method according to the present embodiment is therefore capable of lowering time and cost necessary for dephosphorization of the resist removing liquid after the removal of resist films when the cured resin has a phosphoester group.

2. Method for Producing Etched Metal Plate

A second embodiment of the present invention relates to a method for producing an etched metal plate using a resist film which contains a cured resin having a phosphoester group or a carboxylic group. The method according to the present embodiment can be performed in substantially the same manner as a common method for producing an etched metal plate using the above-described resist film except that the resist film is removed by the method according to the first embodiment of the present invention.

Specifically, the producing method according to the present embodiment includes the steps of: (1) forming a resist film, which contains a cured resin having a phosphoester group or a carboxylic group, in a region where a protrusion is to be formed on the surface of the metal plate; (2) corroding by using an etchant the surface of the metal plate in a region where the resist film is not formed; and (3) removing the resist film from the metal plate having the corroded surface by the method according to the first embodiment of the present invention.

2-1. Step of Forming Resist Film on Metal Plate Surface

In this step, a resist film is formed on the metal plate surface. The resist film contains a cured resin having a phosphoester group or a carboxylic group.

This step forms a resist film containing the cured resin by, for example, curing a curable composition for a resist, which contains a compound having the phosphoester group or a compound having the carboxylic group, on the metal plate surface. The resist film can be formed by, for example, applying a photosensitive resin on the metal plate surface by a coating method or the like, adhering, on the metal plate having the photosensitive resin applied thereon, a negative film which transmits light only to a region where a protrusion is to be formed, irradiating the metal plate with light through the negative film to cure only an exposed portion of the photosensitive resin, and removing a non-exposed, thus non-cured portion of the photosensitive resin. The resist film may also be formed by an ink-jet method. In the ink-jet method, a composition containing the photosensitive resin is discharged from an ink-jet head to deposit a photosensitive resin in a region where a protrusion is to be formed on the metal plate surface, and the deposited photosensitive resin is cured by irradiation with an active energy ray, thereby forming a resist film. The ink-jet method is preferred from the view point of forming resist films more easily and at lower cost.

The cured resin cured by either method may be subjected to heat treatment for improving adhesion by relieving internal stress.

The curable composition may be, for example, a composition curable by irradiation with an active energy ray. In this case, the curable composition contains a compound having a phosphoester group and an ethylenic double bond group (hereinafter, also simply referred to as "polymerizable phosphate compound"), or a compound having a carboxylic group and an ethylenic double bond group (hereinafter, also simply referred to as "polymerizable carboxylic compound"). Irradiating the curable composition containing the polymerizable phosphate compound or the polymerizable carboxylic compound with an active energy ray causes polymerization and crosslinking of the compound due to the ethylenic double bond groups, thereby forming a resist film which contains a cured resin having the phosphoester group or the carboxylic group.

The polymerizable phosphate compound is capable of increasing adhesion between the formed resist film and the metal plate. The polymerizable carboxylic compound is capable of increasing etchant resistance of the formed resist film. Therefore, the curable composition preferably contains the polymerizable phosphate compound, and more preferably contains both the polymerizable phosphate compound and the polymerizable carboxylic compound. The polymerizable carboxylic compound is conventionally also used for increasing alkali solubility of the formed resist film. However, a below-described step of removing the resist film in the present embodiment does not dissolve the resist film in the resist removing liquid, and thus alkali solubility of the resist film is not necessarily high. It is thus possible for the curable composition substantially contain no polymerizable carboxylic compound. This enables use of more various curable compositions for the formation of resist films.

The phosphoester group and the carboxylic group are the above-described respective functional groups. As described above, the phosphoester group is preferably the functional group represented by the above-described formula (a2) or (a3).

The ethylenic double bond group is a functional group having a structure such that a hydrogen atom is abstracted from ethylene. Ethylene may have a substituent. Examples of the ethylenic double bond groups include (meth)acryloyl group, vinyl group and vinylidene group: The ethylenic double bond group is preferably a (meth)acryloyl group due to easy availability of a compound having such a functional group. The (meth)acryloyl group refers to methacryloyl group or acryloyl group.

The polymerizable phosphate compound is preferably prepared by esterification of a compound having a (meth)acryloyl group and a hydroxyl group in the molecule thereof with phosphoric acid ($H_3PO_4$).

Examples of compounds having a (meth)acryloyl group and a hydroxyl group in the molecule thereof include hydroxyalkyl (meth)acrylates such as 2-hydroxymethyl (meth)acrylate, 2-hydroxypropyl (meth)acrylate, 2-hydroxybutyl (meth)acrylate, 4-hydroxybutyl (meth)acrylate, 1,4-cyclohexanedimethanol mono(meth)acrylate; and (poly)ethylene glycol (meth)acrylates such as ethylene glycol (meth)acrylate, diethylene glycol (meth)acrylate, triethylene glycol (meth)acrylate, and tetraethylene glycol (meth)acrylate.

The polymerizable phosphate compound is preferably a compound represented by any one of the following formulas (A1) to (A4) for increasing adhesion with metal and due to its easy availability.

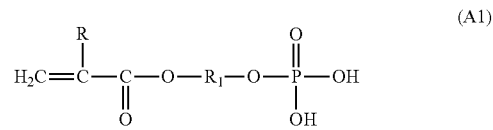
(A1)

In formula (A1), R represents hydrogen atom or methyl group, and $R_1$ represents an alkylene group having 1 or more and 4 or less of carbon atoms. For lowering the viscosity of the curable composition to further increase dischargeability in an ink jet method, R preferably represents methyl group. For further increasing adhesion with metal, $R_1$ preferably represents ethylene group.

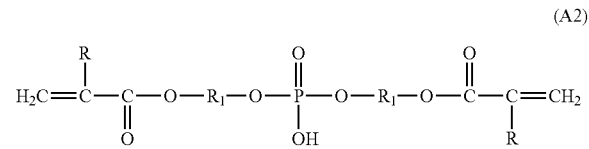
(A2)

In formula (A2), R independently represents hydrogen atom or methyl group, and $R_1$ independently represents an alkylene group having 1 or more and 4 or less of carbon atoms. Independently representing means, for example, a state where one of two Rs may represent hydrogen atom, and the other R may represent methyl group. For lowering the viscosity of the curable composition to increase dischargeability in an ink-jet method, either one or both of Rs preferably represent methyl group. For further increasing adhesion with metal, either one or both of $R_1$s preferably represent ethylene group.

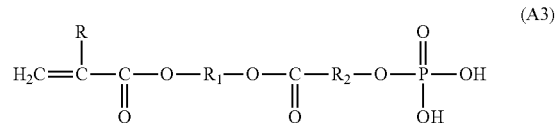
(A3)

In formula (A3), R represents hydrogen atom or methyl group, $R_1$ represents an alkylene group having 1 or more and 4 or less of carbon atoms, and R2 represents an alkylene group having 1 or more and 10 or less of carbon atoms. For lowering the viscosity of the curable composition to increase dischargeability in an ink-jet method, R preferably represents methyl group. For further increasing adhesion with metal, $R_1$ preferably represents ethylene group and $R_2$ preferably represents pentylene group.

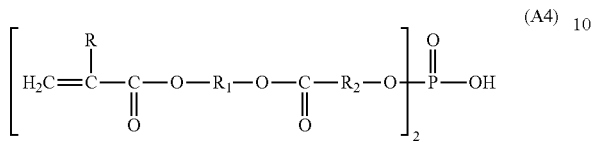

(A4)

In formula (A4), R independently represents hydrogen atom or methyl group, $R_1$ independently represents an alkylene group having 1 or more and 4 or less of carbon atoms, and $R_2$ independently represents an alkylene group having 1 or more and 10 or less of carbon atoms. For lowering the viscosity of the curable composition to increase dischargeability in an ink-jet method, R preferably represents methyl group. For further increasing adhesion with metal, either one or both of $R_1$s preferably represent ethylene group, and either one or both of $R_2$s preferably represent pentylene group.

The curable composition preferably contains the polymerizable phosphate compound in an amount of 0.5 mass % or more and 20 mass % or less based on the total mass of monomers contained in the curable composition. Setting the polymerizable phosphate compound content to 0.5 mass % or more can further increase adhesion between the resist film and metal. Setting the polymerizable phosphate compound content to 20 mass % or less can further increase etchant resistance of the resist film. For further increasing adhesion of the resist film with the metal plate, etchant resistance, and dischargeability in the ink-jet method, the polymerizable phosphate compound content is more preferably 1 mass % or more and 20 mass % or less, still more preferably 1 mass % or more and 15 mass % or less, yet more preferably 2 mass % or more and 12 mass % or less, and particularly preferably 3 mass % or more and 10 mass % or less.

Examples of the polymerizable carboxylic compounds include reaction products of monoesterification of an acid anhydride or a dibasic acid with a hydroxyl group-containing (meth)acrylate. Examples of the dibasic acids and the acid anhydrides include phthalic acid, tetrahydrophthalic acid, hexahydrophthalic acid, maleic acid, succinic acid, and anhydrides thereof. Examples of the hydroxyl group-containing (meth)acrylates include hydroxyalkyl (meth)acrylates, such as 2-hydroxyethyl (meth)acrylate, 2-hydroxypropyl (meth)acrylate, 3-hydroxypropyl (meth)acrylate and 4-hydroxybutyl (meth)acrylate, ethylene oxide and propylene oxide adducts of 2-hydroxyethyl (meth)acrylate.

For further increasing adhesion of the resist film with the metal plate, etchant resistance, and dischargeability in the ink jet method, the polymerizable carboxylic compound is preferably a compound represented by the following formula (B1).

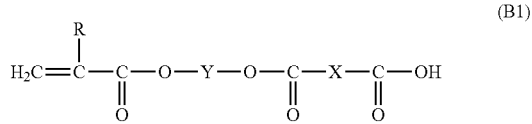

(B1)

In formula (B1), X represents an alkylene group having 1 or more and 3 or less of carbon atoms. When X is $C_1$ alkylene group, the carbonyl group and carboxyl group therein come close together and thus intramolecular association is more likely to occur. When X is an alkylene group having 2 or 3 carbon atoms, the carbon-carbon bond thereof is rotatable and thus intramolecular association is also more likely to occur. Therefore, such a compound represented by formula (B1) is less likely to associate with other molecules, thereby further lowering the viscosity of the curable composition. For increasing the likelihood of occurrence of intramolecular association, X is preferably methylene group or ethylene group, more preferably ethylene group.

In formula (B1), Y represents an alkylene group having 2 or 3 carbon atoms. When Y has 2 or 3 carbon atoms, the distance between the polymerizable functional group and carboxyl group becomes short, and an etchant is less likely to permeate between the functional groups, thereby further increasing etchant resistance of the resist film. Accordingly, Y is preferably ethylene group.

In formula (B1), R represents hydrogen atom or methyl group.

Examples of the compounds represented by formula (B1) include 2-(acryloyloxy)ethyl succinate, 2-(methacryloyloxy)ethyl succinate, 2-(acryloyloxy)propyl succinate, 2-(acryloyloxy)ethyl malonate, and 2-(acryloyloxy)ethyl glutarate.

The curable composition preferably contains the polymerizable carboxylic compound in an amount of 1 mass % or more and 30 mass % or less, more preferably 1 mass % or more and 10 mass % or less, based on the total mass of monomers contained in the curable composition.

The curable composition may contain other polymerizable compounds in addition to the polymerizable phosphate compound and the polymerizable carboxylic compound in a range where the curable composition can be separated using the resist removing liquid. Examples of such polymerizable compounds include monofunctional monomers, such as 2-phenoxyethyl acrylate, acryloylmorpholine, isobornyl acrylate, N-vinylcaprolactam, dimethylacrylamide, 2-hydroxyethyl acrylate, 2-hydroxypropyl acrylate, 4-hydroxybutyl acrylate, isobutyl acrylate, t-butyl acrylate, isooctyl acrylate, cyclohexyl acrylate, dodecyl acrylate, 2-methoxyethyl acrylate, methoxytriethylene glycol acrylate, 2-ethoxyethyl acrylate, tetrahydrofurfuryl acrylate, 3-methoxybutyl acrylate, benzyl acrylate, ethoxyethyl acrylate, butoxyethyl acrylate, ethoxydiethylene glycol acrylate, methoxydipropylene glycol acrylate, methylphenoxyethyl acrylate and dipropylene glycol acrylate; and polyfunctional monomers which do not have a phosphoester group or a carboxylic group. For further increasing strength as well as etchant resistance of the resist film, the polyfunctional monomer preferably has an ethylenic double bond amount, which is defined as "ethylenic double bond amount/monomer's molecular weight," of $4 \times 10^{-3}$ or more and $8 \times 10^{-3}$ mol/g or less.

The curable composition may contain an additional component, such as a photopolymerization initiator and/or a photosensitizes in a range where the curable composition can be separated using the resist removing liquid.

In the case of applying the curable composition on the metal plate surface by a coating method, for more uniform application, the viscosity of the curable composition at 25° C. is preferably 5,000 mPa·s or less, and more preferably 2,000 mPa·s or less. The coating method can be selected from methods capable of applying a curable composition on the metal plate surface. Examples of such methods include spray coating, flow coating and dip coating.

In the case of discharging the curable composition to deposit the same on the metal plate surface by an ink-jet method, for more stably discharging the curable composition, the viscosity of the curable composition at 25° C. is preferably 3 mPa·s or more and 50 mPa·s or less. For further increasing accuracy of printed patterns, the curable composition is preferably discharged after heating the ink-jet head and the curable composition to 35° C. or more and 100° C. or less. The heating is preferably adjusted so that the curable composition temperature falls in a range no more than 5° C. to no less than 5° C., preferably no more than 2° C. to no less than 2° C., and more preferably no more than 1° C. to no less than 1° C., relative to a set temperature.

The ink-jet method may perform discharging in either a piezoelectric method or a thermal method. The ink-jet method deposits and cures the curable composition only in a region where a resist film is to be formed, and thus is capable of easily producing finer patterns and reducing the amount of the curable composition used. Further, the ink-jet method is capable of easily responding to design change only by changing the region where the curable composition is to be deposited, and therefore preferably used in applications requiring variety types of etched metal plates in small lots, such as printed wiring boards.

Examples of active energy rays for irradiating the curable composition include infrared ray, visible ray, ultraviolet ray, X-ray, electron beam, alpha-ray, beta-ray, and gamma-ray. The wavelength of the active energy ray may be appropriately determined in a range where the curable composition cures, and, for further increasing curability of the curable composition, is preferably 250 nm or more and 600 nm or less.

Examples of active energy ray sources include metal halide lamps, mercury lamps, low-pressure mercury lamps, low-pressure solid lasers, xenon flash lamps, black lights, sterilizing lamps, cold-cathode tubes, light emitting diodes (LED), and laser diodes (LD). In view of long life, high luminous efficiency, and low-cost, metal halide lamps, LEDs and LDs are preferred.

2-2. Step of Forming Recess by Corroding Metal Plate Surface Using Etchant

In this step, a recess is formed by corroding the metal plate surface having a resist film formed thereon, by using an etchant. Corrosion using the etchant may be performed by a known method. For example, the recess can be formed in the metal plate surface by immersing in an etchant the metal plate having a resist film formed thereon and corroding the metal plate surface in a region where the resist film is not formed.

2-3. Step of Removing Resist Film

In this step, the resist film is removed from the metal plate etched in the previous step, by the method according to the first embodiment of the present invention.

The removability of the resist removing liquid is less likely to be reduced even though the method according to the present embodiment is performed continuously for long period. Therefore, the method can be performed repeatedly for a longer period without replacing the resist removing liquid, but only by appropriately removing separated resist films and replenishing evaporated water. Accordingly, the method according to the present embodiment can lower time and cost for production of metal plates having an etched surface.

Further, the method according to the present embodiment enables dephosphorization before the drainage of a resist removing liquid to become unnecessary or easier. Therefore, the method according to the present embodiment enables lowering of time and cost necessary for dephosphorization of the resist removing liquid after the removal of resist films, and of time and cost for production of metal plates having an etched surface, which uses a curable composition containing a polymerizable phosphate compound.

EXAMPLES (Preparation of Curable Composition)
The following materials were prepared.
[Polymerizable Phosphate Compound]
  Di[2-methacryloyloxyethyl] acid phosphate (LIGHT ESTER P-2M, available from Kyoeisha Chemical Co., Ltd.)
  2-methacryloyloxyethyl acid phosphate (LIGHT ESTER P-1M, available from Kyoeisha Chemical Co., Ltd.)
[Polyfunctional Monomer]
  Dipropylene glycol diacrylate (APG-100, available from Shin-Nakamura Chemical Co., Ltd.)
[Monofunctional Monomer]
  Dimethyl acrylamide (DMAA, available from kj Chemicals Corporation)
  Isobornyl acrylate (LIGHT ACRYLATE IB-XA, available from Kyoeisha Chemical Co., Ltd.)
[Polymerizable Carboxylic Compound]
  2-(acryloyloxy)ethyl succinate (HOA-MS, available from Kyoeisha Chemical Co., Ltd.)
[Photopolymerization Initiator]
  1-hydroxycyclohexyl phenyl ketone (IRGACURE (registered trade mark) 184, available from BASF Japan Ltd.)
  Bis(2,4,6-trimethylbenzoyl)phenylphosphine oxide (IRGACURE 819, available from BASF Japan Ltd.)

To a homomixer, were charged 0.6 parts by mass of di[2-methacryloyloxyethyl] acid phosphate, 20.0 parts by mass of dipropylene glycol diacrylate, 2.0 parts by mass of dimethyl acrylamide and 57.9 parts by mass of isobornyl acrylate. Under shaded condition, the mixture was heated to 35° C. in a dry air atmosphere and mixed for 1 hour.

To the resultant dispersion, were added 9.0 parts by mass of 1-hydroxycyclohexyl phenyl ketone and 5.0 parts by mass of bis(2,4,6-trimethylbenzoyl)phenylphosphine oxide as photopolymerization initiators, and the mixture was gently mixed until the photopolymerization initiators dissolved. The obtained mixture was press filtered through a 2 μm pore size membrane filter to obtain curable composition 1.

Curable compositions 2 and 3 were prepared in a similar manner except that the types and amounts of the polymerizable phosphate compound, polyfunctional monomer, monofunctional monomer, polymerizable carboxylic compound and photopolymerization initiator were changed as shown in Table 1. In the table, each component value for each curable composition indicates the component content (mass %) in the curable composition.

TABLE 1

Composition of Curable Compositions 1 to 3

| Component | | Nomenclature of Compound | Curable Composition 1 | Curable Composition 2 | Curable Composition 3 |
|---|---|---|---|---|---|
| Composition (mass %) | Polymerizable Phosphate Compound | Di[2-methacryloyloxyethyl] acid phosphate | 0.6 | 3.0 | 6.0 |
| | | 2-methacryloyloxyethyl acid phosphate | 0 | 2.0 | 5.0 |
| | Polyfunctional Monomer | Dipropylene glycol diacrylate | 20.0 | 15.0 | 10.0 |
| | Monofunctional Monomer | Dimethyl acrylamide | 2.0 | 7.0 | 15.0 |
| | | Isobornyl acrylate | 57.9 | 53.5 | 44.5 |
| | Polymerizable Carboxylic Compound | 2-(acryloyloxy)ethyl succinate | 5.5 | 5.5 | 5.5 |
| | Photopolymerization Initiator | Photopolymerization Initiator 1 (*1) | 9.0 | 9.0 | 9.0 |
| | | Photopolymerization Initiator 2 (*2) | 5.0 | 5.0 | 5.0 |

(*1): 1-hydroxycyclohexyl phenyl ketone
(*2): Bis(2,4,6-trimethylbenzoyl)phenylphosphine oxide (Preparation of Resist Removing Liquid)

The following materials were prepared.

[Solvent]

Benzyl alcohol (Benzyl alcohol, available from SunChemical Co., Ltd.)

Water

[Surfactant]

(Anionic Surfactant)

Sodium 2,4-xylene sulfonate (SXS-Y, available from ITOCHU CHEMICAL FRONTIER Corporation)

Sodium dodecyl benzene sulfonate (NEWCOL 210, available from NIPPON NYUKAZAI Co., Ltd.)

(Nonionic Surfactant)

Polyoxyalkylene alkyl ether (NOIGEN (registered trade mark) ET-165, available from DKS Co. Ltd.)

(Cationic surfactant)

Stearyltrimethylammonium chloride (QUARTAMIN (registered trade mark) 86P CONC, available from Kao Corporation)

To a homomixer, were charged 45.0 parts by mass of benzyl alcohol, 40.0 parts by mass of water and 15.0 parts by mass of sodium 2,4-xylene sulfonate. Under shaded condition, the mixture was heated to 60° C. in a dry air atmosphere and mixed for 1 hour to prepare resist removing liquid 1.

Resist removing liquids 2 to 15 were prepared in a similar manner except that the types and amounts of benzyl alcohol, water and the surfactant were changed as shown in Tables 2 to 4. In the tables, each component value for each resist removing liquid indicates the component content (mass %) in the resist removing liquid. Each of the values in the row of "mass ratio of water to benzyl alcohol" is a value determined by dividing the water content (mass %) by the benzyl alcohol content (mass %).

TABLE 2

Composition of Resist Removing Liquids 1 to 6

| Component | | Resist Removing Liquid 1 | Resist Removing Liquid 2 | Resist Removing Liquid 3 | Resist Removing Liquid 4 | Resist Removing Liquid 5 | Resist Removing Liquid 6 |
|---|---|---|---|---|---|---|---|
| Solvent | Benzyl alcohol | 45 | 45 | 45 | 45 | 65 | 55 |
| | Water | 40 | 40 | 40 | 40 | 20 | 30 |
| Surfactant | Anionic Surfactant 1 (*1) | 15 | — | — | — | 15 | 15 |
| | Anionic Surfactant 2 (*2) | — | 15 | — | — | — | — |
| | Nonionic Surfactant (*3) | — | — | 15 | — | — | — |
| | Cationic Surfactant (*4) | — | — | — | 15 | — | — |
| Mass ratio of water to benzyl alcohol | | 0.89 | 0.89 | 0.89 | 0.89 | 0.31 | 0.55 |

(*1) Sodium 2,4-xylene sulfonate
(*2) Sodium dodecyl benzene sulfonate
(*3) Polyoxyalkylene alkyl ether
(*4) Stearyltrimethylammonium chloride

TABLE 3

Composition of Resist Removing Liquids 7 to 11

| Component | | Resist Removing Liquid 7 | Resist Removing Liquid 8 | Resist Removing Liquid 9 | Resist Removing Liquid 10 | Resist Removing Liquid 11 |
|---|---|---|---|---|---|---|
| Solvent | Benzyl alcohol | 50 | 40 | 35 | 30 | 25 |
| | Water | 35 | 45 | 50 | 55 | 60 |

TABLE 3-continued

Composition of Resist Removing Liquids 7 to 11

| | Component | Resist Removing Liquid 7 | Resist Removing Liquid 8 | Resist Removing Liquid 9 | Resist Removing Liquid 10 | Resist Removing Liquid 11 |
|---|---|---|---|---|---|---|
| Surfactant | Anionic Surfactant 1 (*1) | 15 | 15 | 15 | 15 | 15 |
| | Anionic Surfactant 2 (*2) | — | — | — | — | — |
| | Nonionic Surfactant (*3) | — | — | — | — | — |
| | Cationic Surfactant (*4) | — | — | — | — | — |
| Mass ratio of water to benzyl alcohol | | 0.70 | 1.13 | 1.43 | 1.83 | 2.40 |

(*1) Sodium 2,4-xylene sulfonate
(*2) Sodium dodecyl benzene sulfonate
(*3) Polyoxyalkylene alkyl ether
(*4) Stearyltrimethylammonium chloride

TABLE 4

Composition of Resist Removing Liquids 12 to 15

| | Component | Resist Removing Liquid 12 | Resist Removing Liquid 13 | Resist Removing Liquid 14 | Resist Removing Liquid 15 |
|---|---|---|---|---|---|
| Solvent | Benzyl alcohol | 0 | 23 | 20 | 70 |
| | Water | 85 | 62 | 65 | 15 |
| Surfactant | Anionic Surfactant 1 (*1) | 15 | 15 | 15 | 15 |
| | Anionic Surfactant 2 (*2) | — | — | — | — |
| | Nonionic Surfactant (*3) | — | — | — | — |
| | Cationic Surfactant (*4) | — | — | — | — |
| Mass ratio of water to benzyl alcohol | | — | 2.70 | 3.25 | 0.21 |

(*1): Sodium 2,4-xylene sulfonate
(*2): Sodium dodecyl benzene sulfonate
(*3): Polyoxyalkylene alkyl ether
(*4): Stearyltrimethylammonium chloride Example 1

Using an inkjet printer equipped with a piezoelectric inkjet head, curable composition 1 is discharged onto the surface of a 0.5 mm-thick stainless steel plate (SUS304, BA finishing) to print an uncured resist in the size of 1 cm×5 cm.

About 0.4 seconds after the printing, the metal plate was irradiated with UV light using UV irradiator (metal halide lamp M0151-L212, available from Eye Graphics Co., Ltd., 1 lamp: 120 W), to cure the curable composition, thereby obtaining a resist film. During the procedure, metal plate feed rate was set to 10 m/min, and UV irradiation was performed 4 times. The metal plate irradiated with UV light was then subjected to heat treatment at 120° C. for 15 minutes in an oven. The thus formed resist film had a uniform thickness of 8 μm.

(Removal of Resist Film)

The metal plate having the resist film formed thereon was immersed in resist removing liquid 1 which was heated to 60° C., and the time it took until the separation of the printed resist film from the metal plate was visually confirmed was measured.

Removability of the resist removing liquid was evaluated on the basis of the measured time. Evaluation criteria were as follows.

A: Separation occurred in one minute or less after immersion

B: Separation occurred in more than one minute and two minutes or less after immersion C: Separation occurred in more than two minutes and 10 minutes or less after immersion D: Separation did not occur even in more than 10 minutes after immersion Examples 2 to 13 and Comparative Examples 1 to 4

The removability of each resist removing liquid was evaluated by measuring the time it took for the printed resist film to be separated from the metal plate, in substantially the same manner as Example 1 except for using the combination of the curable composition and the resist removing liquid shown in Table 5.

Table 5 shows the results.

TABLE 5

Time until Separation occurs and Evaluation Results

| | | | Test Results | |
|---|---|---|---|---|
| | Curable Composition | Resist Removing Liquid | Time until Separation occurs (min) | Removability |
| Example 1 | 1 | 1 | 2.0 | B |
| Example 2 | 2 | 1 | 1.8 | B |
| Example 3 | 3 | 1 | 1.4 | B |
| Example 4 | 3 | 2 | 1.8 | B |
| Example 5 | 3 | 3 | 2.0 | B |
| Example 6 | 3 | 4 | 2.0 | B |
| Example 7 | 3 | 5 | 2.0 | B |
| Example 8 | 3 | 6 | 1.8 | B |
| Example 9 | 3 | 7 | 1.6 | B |
| Example 10 | 3 | 8 | 1.2 | B |

TABLE 5-continued

Time until Separation occurs and Evaluation Results

| | Curable Composition | Resist Removing Liquid | Test Results | |
|---|---|---|---|---|
| | | | Time until Separation occurs (min) | Removability |
| Example 11 | 3 | 9 | 0.9 | A |
| Example 12 | 3 | 10 | 0.7 | A |
| Example 13 | 3 | 11 | 1.8 | B |
| Comparative Example 1 | 3 | 12 | Separation did not occur | D |
| Comparative Example 2 | 3 | 13 | 2.8 | C |
| Comparative Example 3 | 3 | 14 | 4.8 | C |
| Comparative Example 4 | 3 | 15 | 3.8 | C |

The resist removing liquids which contain benzyl alcohol, water with a mass ratio to benzyl alcohol of 0.3 or more and 2.5 or less, and a surfactant were capable of removing from a metal plate a resist film containing a cured resin having a phosphoester group and a carboxylic group. During the procedure, the resist film was removed by separation from the metal plate, and thus it could have been deduced that a compound having the phosphoester group or a compound having the carboxylic group was not dissolved into the resist removing liquid. Further, foam to be generated by foaming of the compound was not visually confirmed.

In particular, removability of the resist removing liquid became the highest when the mass ratio of water to benzyl alcohol is 1.2 or more and 2.0 or less.

Water containing no benzyl alcohol, meanwhile, could not separate a resin film. A resist removing liquid containing water with a mass ratio to benzyl alcohol of 2.5 or more had low resist removability.

Example 14

The phosphorus concentration of the resist removing liquid used in Example 12, after 100 ml thereof was used for removing a resist film 10 times, was measured by a combination of potassium peroxodisulfate decomposition method (testing method for industrial wastewater JIS K 0102 46.3.1) and molybdenum blue absorptiometry (testing method for industrial wastewater JIS K 0102 46.1.1). No phosphorus was detected.

Comparative Example 5

A resist film formed by curing curable composition 3 in the same manner as in Example 12 was immersed in 5 wt % aqueous sodium hydroxide solution at 60° C. for 20 minutes to be dissolved and removed. When the phosphorus concentration in the aqueous sodium hydroxide solution was measured in the same method as in Example 14, 4 mg/L of phosphorus was detected.

The method of the present invention removed phosphorus in a cured resin by separation, and thus no phosphorus remained after the removal of a resist film. The conventional method, on the other hand, left a large amount of phosphorus in the resist removing liquid.

This application claims priority based on Japanese Patent Application No. 2015-173829, filed on Sep. 3, 2015, the entire contents of which including the claims and the specification are incorporated herein by reference.

INDUSTRIAL APPLICABILITY

The method of the present invention is capable of easily removing a resist film containing a cured resin having a phosphoester group from a metal plate, and of prolonging the life of a resist removing liquid. Therefore, the present invention enables etching of a large number of metal plates more easily and at lower cost, and thus is expected to contribute to expansion and development of metal plate etching.

The invention claimed is:

1. A method for removing from a metal plate a resist film disposed thereon, the method comprising: bringing the resist film in contact with a resist removing liquid, the resist film containing a cured resin having a phosphoester group and/or a carboxylic group, wherein:
    the resist removing liquid contains benzyl alcohol, water with a mass ratio to benzyl alcohol of 0.3 or more and 2.5 or less, and a surfactant, the resist removing liquid being substantially free of caustic alkali component.

2. The method according to claim 1, wherein the resist film contains the cured resin having the phosphoester group.

3. The method according to claim 1, wherein the resist film contains the cured resin having the phosphoester group and the carboxylic group.

4. The method according to claim 1, wherein the surfactant is at least one surfactant selected from the group consisting of anionic surfactants, cationic surfactants and nonionic surfactants.

5. The method according to claim 1, wherein the surfactant has an amount of 3 mass % or more and 20 mass % or less based on a total mass of the resist removing liquid.

6. The method according to claim 1, wherein the resist removing liquid to be in contact has a liquid temperature of 30° C. or more and 80° C. or less.

7. A method for producing an etched metal plate, the method comprising:
    forming a resist film in a region where a protrusion is to be formed on a surface of a metal plate, the resist film containing a cured resin having a phosphoester group or a carboxylic group;
    corroding, by using an etchant, the surface of the metal plate in a region where the resist film is not formed; and
    removing the resist film from the metal plate having the corroded surface by the method according to claim 1.

8. The method for producing an etched metal plate according to claim 7, wherein:
    the forming the resist film includes:
    depositing a curable composition in the region where the protrusion is to be formed on the surface of the metal plate, by discharging the curable composition from an ink-jet head, the curable composition containing a compound having a phosphoester group and an ethylenic double bond or a compound having a carboxylic group and the ethylenic double bond, and
    curing the curable composition deposited on the surface of the metal plate by irradiation with an active energy ray.

* * * * *